(12) United States Patent
Van Delden

(10) Patent No.: US 11,006,498 B2
(45) Date of Patent: May 11, 2021

(54) ROBUST UV-C ANTI-FOULING DEVICE HAVING A SINGLE-WIRE POWER SOURCE

(71) Applicant: KONINKLIJKE PHILIPS N.V., Eindhoven (NL)

(72) Inventor: Martinus Hermanus Wilhelmus Maria Van Delden, Venlo (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/739,270

(22) Filed: Jan. 10, 2020

(65) Prior Publication Data

US 2020/0196416 A1    Jun. 18, 2020

Related U.S. Application Data

(63) Continuation of application No. 16/063,450, filed as application No. PCT/EP2016/081091 on Dec. 15, 2016, now Pat. No. 10,555,388.

(30) Foreign Application Priority Data

Dec. 23, 2015   (EP) ..................... 15202407

(51) Int. Cl.
*H05B 45/37*   (2020.01)
*H01L 33/36*   (2010.01)
(Continued)

(52) U.S. Cl.
CPC ............. *H05B 45/40* (2020.01); *B08B 17/02* (2013.01); *H01L 33/36* (2013.01); *H05B 45/37* (2020.01);
(Continued)

(58) Field of Classification Search
CPC ........ B08B 7/0057; B08B 17/02; H01G 7/06; H02J 3/00; H02J 50/05; H05B 45/00;
(Continued)

(56) References Cited

U.S. PATENT DOCUMENTS 5,088,432 A   2/1992 Usami et al.
5,552,656 A   9/1996 Taylor
(Continued)

FOREIGN PATENT DOCUMENTS

WO    2000050809 A1    8/2000
WO    2009153715 A2    12/2009
(Continued)

OTHER PUBLICATIONS

"High frequency AC electrolysis of water", Integrated Devices and Systems (IDS), University of Twente, Feb. 2018.
(Continued)

*Primary Examiner* — Jimmy T Vu

(57) ABSTRACT

A UV-C anti-fouling device that is coupled to power source using a single power supply wire. The device is AC powered, and is capacitively coupled to the conductive surface that is being protected, such as the hull of a ship. The device includes a plurality of UV-C LEDs that are either powered during half-cycles of the AC supply, or powered via individual rectifier circuits, such as a diode bridge, or Graetz bridge. A light guide optically extends the light from the UV-C LEDs. The arrangement is robust against shorts and opens, as well as external inflicted damage.

15 Claims, 9 Drawing Sheets

(51) Int. Cl.
  *H05B 45/40* (2020.01)
  *B08B 17/02* (2006.01)
  *H02J 50/05* (2016.01)
  *H01G 7/06* (2006.01)
  *H02J 3/00* (2006.01)
  *B63B 59/04* (2006.01)

(52) U.S. Cl.
  CPC ............... *B63B 59/04* (2013.01); *H01G 7/06* (2013.01); *H02J 3/00* (2013.01); *H02J 50/05* (2016.02)

(58) Field of Classification Search
  CPC ........ H05B 45/37; H05B 45/40; B63B 59/04; H01L 33/36; A61L 2/10; A61L 2/0047
  See application file for complete search history.

(56) References Cited

U.S. PATENT DOCUMENTS

| | | | |
|---|---|---|---|
| 5,643,424 A | 7/1997 | Riffe | |
| 5,820,737 A | 10/1998 | Kohn | |
| 6,285,629 B1 | 9/2001 | Shigihara et al. | |
| 7,111,428 B1 | 9/2006 | Ostlie | |
| 8,994,223 B2 * | 3/2015 | Richter | H02J 50/05 307/104 |
| 9,209,674 B2 * | 12/2015 | Spinella | H02M 3/3385 |
| 9,585,205 B2 | 2/2017 | De Samber et al. | |
| 9,611,016 B2 * | 4/2017 | Salters | A61L 2/10 |
| 10,040,525 B2 * | 8/2018 | Salters | G02B 6/0043 |
| 10,556,651 B2 * | 2/2020 | Salters | B63B 59/04 |
| 2010/0283389 A1 * | 11/2010 | Frederick | H01J 65/044 315/39 |
| 2013/0048877 A1 | 2/2013 | Thoren et al. | |
| 2016/0185623 A1 * | 6/2016 | Hanada | C02F 1/325 250/435 |
| 2017/0334114 A1 * | 11/2017 | Sticklus | H05K 3/284 |

FOREIGN PATENT DOCUMENTS

| | | |
|---|---|---|
| WO | 2014060921 A1 | 4/2014 |
| WO | 2014132164 A2 | 9/2014 |
| WO | 2014188347 A1 | 11/2014 |

OTHER PUBLICATIONS

Butler, L., "Underwater Radio Communication", Originally published in Amateur Radio, Apr. 1987.

* cited by examiner

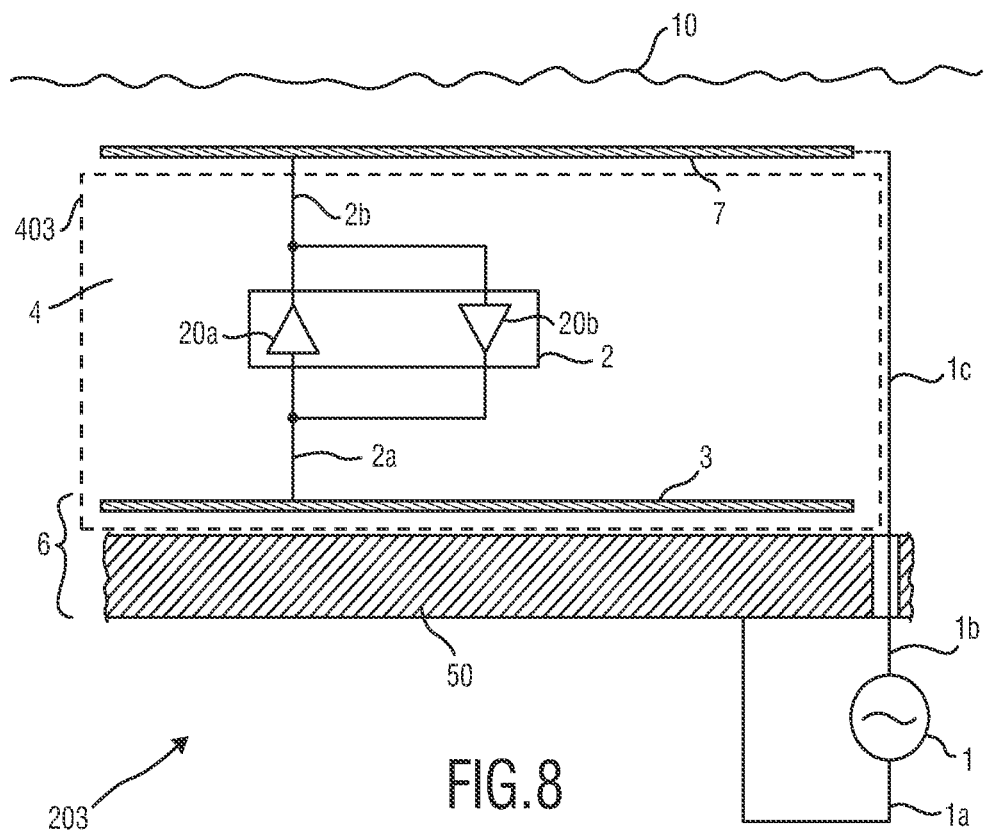
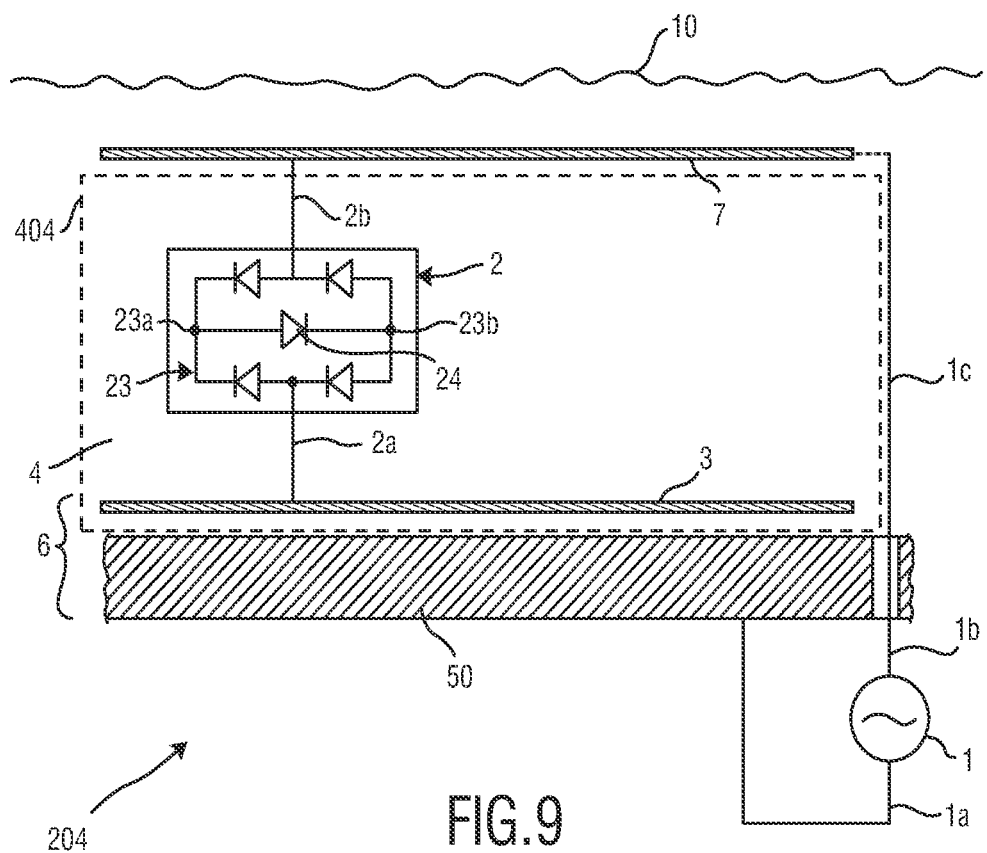

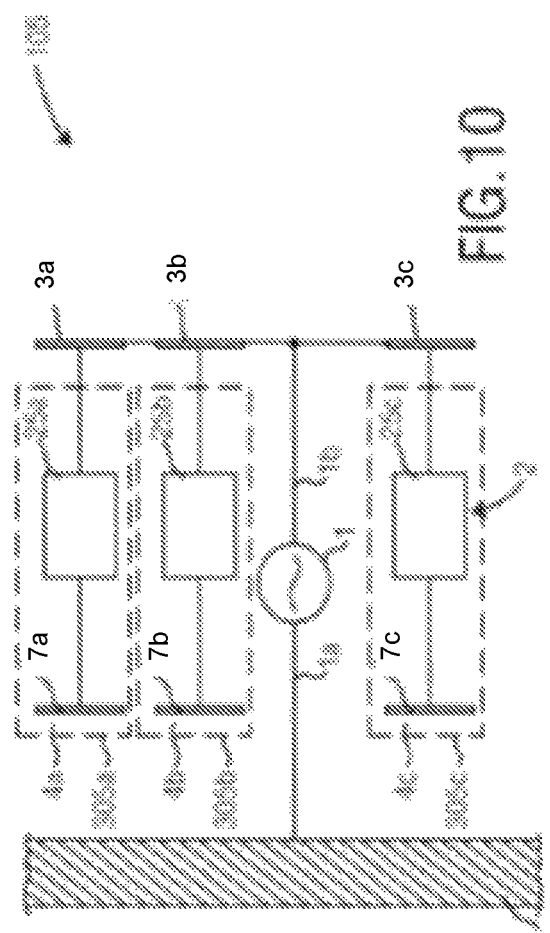
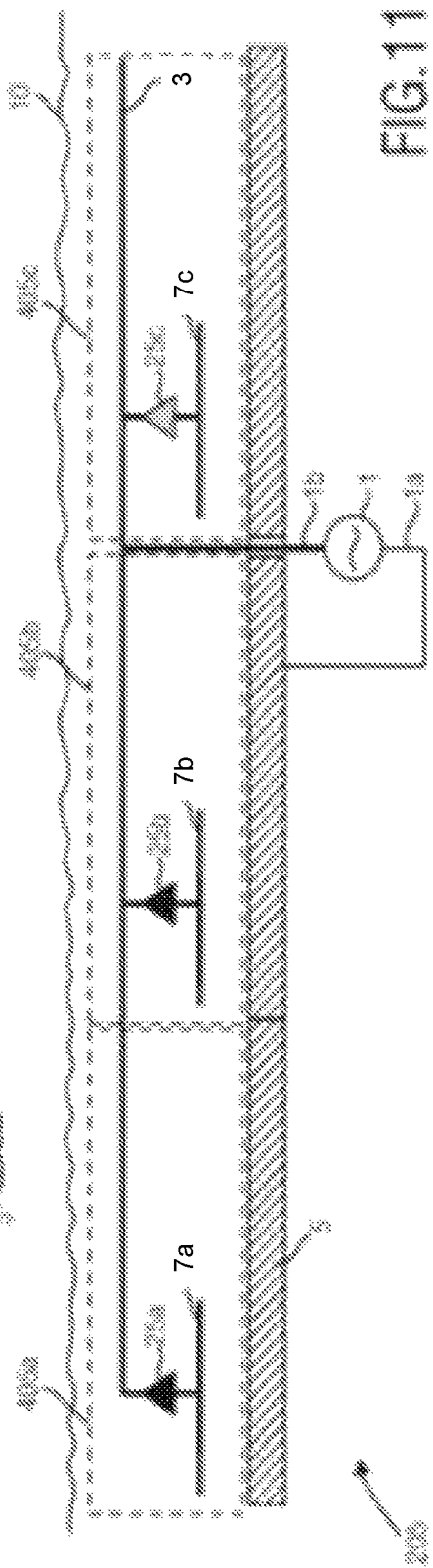

ROBUST UV-C ANTI-FOULING DEVICE HAVING A SINGLE-WIRE POWER SOURCE

CROSS-REFERENCE TO PRIOR APPLICATIONS

This application a continuation of U.S. application Ser. No. 16/063,450 filed Jun. 18, 2018, now U.S. Pat. No. 10,555,388, issued 4 Feb. 2020, which claims the benefit of International Application No. PCT/EP2016/081091 filed on Dec. 15, 2016, which claims the benefit of European Patent Application No. 15202407.1, filed on Dec. 23, 2015. These applications are hereby incorporated by reference herein.

FIELD OF THE INVENTION

The present invention relates to a load arrangement for use in an electrical power arrangement and for arrangement at a first external electrically conductive element. The present invention relates further to an electrical power arrangement for powering a load of such a load arrangement.

BACKGROUND OF THE INVENTION

WO 2009/153715 A2 discloses a light emitting device comprising a first common electrode, a structured conducting layer, forming a set of electrode pads electrically isolated from each other, a dielectric layer, interposed between the first common electrode layer and the structured conducting layer, a second common electrode, and a plurality of light emitting elements. Each light emitting element is electrically connected between one of the electrode pads and the second common electrode, so as to be connected in series with a capacitor comprising one of the electrode pads, the dielectric layer, and the first common electrode. When an alternating voltage is applied between the first and second common electrodes, the light emitting elements will be powered through a capacitive coupling, also providing current limitation. During operation of the light emitting device, a short-circuit failure in one light emitting element will affect only light emitting elements connected to the same capacitor. Further, the short-circuit current will be limited by this capacitor.

In certain application scenarios such a light emitting device, in particular the way of powering the light emitting device (or generally a load), has disadvantages, e.g. due to the electrical connection between the common electrode layer and the AC voltage source. Such application scenarios include, for instance, systems for anti-fouling of a surface (e.g. a ship hull) while said surface is at least partially submersed in an liquid environment (e.g. sea water), in which UV light is emitted by light sources mounted in some way to the outer surface of the ship hull to counter biofouling of the ship hull.

WO 2014/060921 A1 discloses an LED package arranged to emit light when connected to an AC power supply, comprising a first and a second LED package terminal, at least one pair of diodes connected in anti-parallel between the LED package terminals, wherein at least one of the diodes is a light emitting diode. The first LED package terminal is detachably connectable to a first power supply terminal, and adapted to form a first capacitive coupling together with the first power supply terminal, and the second LED package terminal is detachably connectable to a second power supply terminal, and adapted to form a second capacitive coupling together with the second power supply terminal. By providing electrical connections which are less sensitive to temperature dependent degradation, the life time of the LED package may be increased.

SUMMARY OF THE INVENTION

It is an object of the present invention to provide an improved load arrangement and an improved electrical power arrangement for powering a load, which can be used in particular application scenarios under more difficult environmental conditions with little or even no loss of performance and without the risk of getting damaged, e.g. due to exposure to environmental influences, such as exposure to sea water.

In a first aspect of the present invention a load arrangement is presented comprising
   a load,
   a first electrode electrically connected to the load,
   a dielectric layer,
wherein the load, the first electrode and the dielectric layer form a structure, which is configured for being arranged at the first external electrically conductive element,
wherein the first electrode and the dielectric layer are arranged to form, in combination with a first external electrically conductive element representing an outer surface of a marine structure, a capacitor for capacitive transmission of electrical power between the first electrode and the first external element,
wherein the carrier is configured for being arranged at the first external electrically conductive element, and
wherein the load is connected to a second electrode electrically insulated from the first electrode or is arranged for being electrically connected to a second external electrically conductive element electrically insulated from the first electrode.

In a further aspect of the present invention an electrical power arrangement is presented comprising
   an AC power source and
   a load arrangement as disclosed herein.

In still a further aspect of the present invention a marine structure, such as a ship, is presented having an outer surface comprising a load arrangement as disclosed herein, wherein the load arrangement is attached to said outer surface.

Preferred embodiments of the invention are defined in the dependent claims. It shall be understood that the claimed electrical power arrangement and the claimed marine structure have similar and/or identical preferred embodiments as the claimed load arrangement, in particular as defined in the dependent claims and as disclosed herein.

The present invention is based on the idea to modify and optimize the use of capacitive power transfer for application in challenging environments, such as in the wet, conductive and harsh ambient environment of the sea. Furthermore, the electric circuit of the load arrangement and of the electrical power arrangement has been adapted for robustness against moderate and severe impact as well as surface cutting damage at various levels, such as for example UV-C LEDs (as loads) developing one or more open or short-circuit connections. This is achieved by making use of a first external electrically conductive element, which forms a capacitor together with the first electrode and the dielectric layer for capacitive transmission of electrical power between the first electrode and the first external element. The electrical power may thereby be provided by an AC power source, whose first AC terminal is electrically connected to the first external element providing a clearly defined voltage potential at the first external element when the electrical power arrangement is in use.

According to the arrangement disclosed in WO 2009/153715 A2 a rigid carrier is deployed to carry electronic components such as for example LEDs. A disadvantage of this carrier is that it is only bendable to some extent, yet, even than it will be difficult to apply such carriers to three dimensional curved surfaces, such as the surfaces of a ship hull. Furthermore, although such carriers may be built segmented to yield more flexibility, the freedom of placement of such carriers is limited. To that end, the carrier is preferably broken or cut into individual subcarriers, thereby disrupting the common power supply terminal. In contrast, according to the present disclosure a sticker like arrangement, e.g. placed on a carrier, is chosen to cope i) with contoured surfaces and ii) to allow for full freedom of (partially overlapping) placement, while still ensuring a common power supply terminal by means of using of a common liquid conductor, such as water or sea water. Furthermore, it is desirable that only submerged loads are operated, for example for safety and energy efficiency. Since the water level along the hull self-adapts to the varying sailing speeds of the ship, the weather conditions at sea and the cargo loading conditions of the ship, it may be clear that also the common power supply terminal adapts instantaneously without the need for controlling electronics.

According to the present invention the load, the first electrode and the dielectric layer form a structure. It shall be understood that the structure may not only be formed from these elements, but that additional elements may be provided to form the structure. In some embodiments these elements themselves are configured to form the structure (e.g. the load and the first electrode dielectric layer may be embedded in dielectric material of the dielectric layer thus forming the structure). In other embodiments one or more additional elements (e.g. a carrier, a substrate, an adhesive layer, etc.) are provided to form the structure together with these three elements.

In an embodiment the load arrangement further comprises a carrier carrying the load, the first electrode and the dielectric layer and being configured for being arranged at the first external electrically conductive element. This enables a flexible use and handling of the load arrangement. Together with the load, the first electrode and the dielectric layer the carrier carries a form a structure, which is configured for being arranged at the first external electrically conductive element. Generally, there may be load arrangement with or without carrier.

The carrier is preferably in sheet form, wherein at least one surface of the carrier is covered with an adhesive material. The carrier may thus e.g. be configured like a sticker, tile or wallpaper that can be easily attached to other entities by use of the adhesive material.

The load arrangement may further comprise a film that is removably attached to the surface covered with the adhesive material. Thus, the adhesive material is protected before use, and only before use the film is removed.

The size and/or form of the carrier is preferably made to match the form and/or size of an area of application, i.e. can be pre-manufactured according to the desired use scenario. For instance, if configured like a sticker, the layout of the sticker may be made according to expected fouling layout. The fouling amount would differ on different areas of the hull based on the shape of the relevant area, the depth within water of the relevant area, the temperature of the relevant area based on the distance to the motor etc. Accordingly, there will be areas where more fouling occurs and areas where it is less.

It is thus preferred to apply the sticker to areas that will be submerged. Furthermore, some areas may be more sensitive to fouling than others, due to for example different depths and water speeds along the hull. Hence, areas being more susceptible to fouling may carry stickers that provide more cleaning power, such for example higher power LEDs or a denser sticker arrangement or it may be made to match different areas of the first external electrically conductive element.

In another embodiment the surface of the carrier (i.e. the surface that is not used to mount the load arrangement to another entity and/or the outer surface of the load arrangement opposite to the surface of the carrier covered with the adhesive material is covered with an adhesive material, in particular for receiving a light guide or dithering surface on one of the surfaces. For instance, both surfaces of the carrier may be covered with an adhesive material.

To allow different application scenarios, e.g. the mounting of the load arrangement to a curved surface, the carrier is preferably made of flexible material, such as a (thermo-) plastic material, that is also resistant to the environment in which the load arrangement is used. The used material has preferably a low power dissipation factor D, for which purpose the dielectric layer, carrier and adhesive are used. Further, the used materials do not absorb (sea) water and in particular no externally present conductive ions (in the sea water). Still further, at least some of the materials are rugged (i.e. mechanically resistant against impact). To achieve this effect, the carrier material may consist of a stack or mixture of multiple (hybrid) materials, with each material component at least fulfilling one or more of the above mentioned desired requirements. Further alternatives such as paper soaked into water resistant material or a casted version which need not be flexible are available.

In another embodiment the carrier comprises an indicator for installation of the load arrangement, in particular for indicating the installation position and/or installation direction and/or overlap possibility. This makes the installation of the load arrangement easier. The indicator may e.g. be a line or arrow, but can generally be any other indicator.

Additionally or alternatively, the carrier may comprise an indicator indicating where to cut the carrier. This may help to prevent the user from cutting areas where electrical lines or elements are placed on the carrier, which could be damaged by cutting the carrier.

Multiple carriers, e.g. stickers, may be arranged on a rollable film so that a user can cut off from said roll as many load arrangements as desired.

The load arrangement may also be configured to be cut to measure or may be pre-cut accordingly. This allows a more flexible use of the proposed load arrangement.

The first external element may be selected from the group of electrically conductive elements comprising water, in particular sea water, an environmental object, in particular a part of a building or vehicle, and an infrastructural object. For instance, the first external element may be a ship hull, to which a plurality of load arrangements (e.g. each comprising one or more UV-LEDs) are mounted to counter bio-fouling. The ship hull can thus be favorably used as one electrode of the first capacitor and thus avoids providing galvanic connections between a first AC terminal of the AC power source and a first load terminal of the load (the one or more UV-LEDs), i.e. the ship hull needs not to be pierced to provide such galvanic connections and thus leads to a better construction and less deterioration of the ship hull.

For connection of the second AC terminal different options exists. According to one embodiment the electrical power arrangement comprises a second electrode that is electrically connected to a second load terminal and a second AC terminal. Plural load arrangements may share the same second electrode so that the number of galvanic connections between the second AC terminal of the AC power source and the second electrode can be limited to a minimum.

According to another embodiment the second AC terminal and the second load terminal are electrically connected to a second external electrically conductive element, which is insulated from the first external element and which is selected from the group of electrically conductive elements comprising water, in particular sea water, an environmental object, in particular a part of a building or vehicle, and an infrastructural object. Hence, in certain applications, depending on the circumstances, existing elements may be used to form a second capacitor or use the effect of self-capacitance for power transfer between the second AC power terminal and the second load terminal.

According to another embodiment the load arrangement further comprises an electrically conductive current guidance member for being arranged within or attached to the second external element and the load. This current guidance member further supports the current path between the AC power source, e.g. a second AC terminal thereof, and the load, e.g. a second load terminal. It guides the current between these elements, but is generally not in galvanic contact with the AC power source and the load.

Further, the electrical power arrangement may comprise a DC power line for being arranged within or attached to the second external element. Preferably, it is electrically connected to the AC power source, e.g. the second AC terminal. This DC power line may e.g. be an existing DC power line, as e.g. used by ships to impress a DC current into the sea water to provide cathodic protection against natural corrosion.

Still further, a housing accommodating the load, the first electrode and the dielectric layer may be provided. The housing including these elements may thus be manufactured and used a modular units (or tiles) which can be separately exchanged in case of malfunction and which can be arbitrarily combined as needed by the respective application. Hereby, the housing may be represented by a separate casing or box, e.g. of a protective material against the influences of the environment, but may alternatively be represented by the dielectric material of the dielectric layer, which may encapsulate the load and the first electrode.

In another embodiment the load arrangement may further comprise a second electrode electrically connected to a second load terminal of the load and a second AC terminal of the AC power source and accommodated in the housing.

In particular applications the electrical power arrangement comprises a plurality of loads, whose first load terminals are coupled in parallel to a common first electrode or separate first electrodes and whose second load terminals are coupled in parallel to a common second electrode, separate second electrodes or the second external element. Thus, various options exist for coupling the loads together. Preferably, several loads share a common AC power source to reduce the number of connections between the AC power source and the loads.

For use in an implementation directed to counter bio-fouling, where the first external element may be a ship hull, the load preferably comprises a light source, in particular an LED or an UV-LED (e.g. an UV-C LED).

Further, the load may comprise a diode bridge circuit, wherein the light source is coupled between the midpoints of the diode bridge circuit. The load may thus be considered as being sub-divided into multiple sub-loads by deploying e.g. four low-cost Schottky diodes as a Graetz bridge (or Graetz circuit), thereby providing a local DC power supply (e.g. serving one or more light sources). This local DC power source can also be used to operate other polarity sensitive electronics or any other electronic circuit that requires DC power, such as a fouling monitor sensor and controller IC(s) in an anti-fouling application.

In another embodiment the load comprises a first LED and a second LED coupled anti-parallel to each other. This further improves the operation of the LEDs by means of an AC power source (e.g. an oscillator). However, due to the higher costs of one UV-C LED compared to four Schottky diodes the Graetz bridge is more cost effective in providing power during the full AC cycle.

According to one aspect the present invention is directed to a marine structure, such as a ship or boat or vessel, having an outer surface comprising a load arrangement as disclosed herein, wherein the load arrangement is attached to the said outer surface. The marine structure may comprise an energy source for providing the energy for powering the load of the load arrangement Said energy source may be a generator, an engine, a battery, a chemical reactor (for generating energy by a chemical reaction of a substance e.g. with water) or generally any kind of source that is able to provide sufficient electrical energy for powering the load of the load arrangement. Said energy source may be coupled to, or comprise, or represent the AC power source.

In a further aspect the present invention relates to a method for installing a load arrangement as disclosed herein to an outer surface of a marine structure, e.g. a ship hull.

In a still further aspect the present invention relates to the use of a load arrangement as disclosed herein for installation to an outer surface of a marine structure, in particular to counter bio-fouling of the outer surface, e.g. a ship hull.

BRIEF DESCRIPTION OF THE DRAWINGS

These and other aspects of the invention will be apparent from and elucidated with reference to the embodiment described hereinafter. In the following drawings FIG. 8 shows a schematic diagram of a fourth embodiment of an electrical power arrangement according to the present invention in an anti-fouling application scenario, FIG. 9 shows a schematic diagram of a fifth embodiment of an electrical power arrangement according to the present invention in an anti-fouling application scenario, FIG. 10 shows a schematic diagram of a sixth embodiment of an electrical power arrangement according to the present invention, FIG. 11 shows a schematic diagram of the sixth embodiment of an electrical power arrangement in an anti-fouling application scenario.

DETAILED DESCRIPTION OF THE INVENTION

Figure 1:
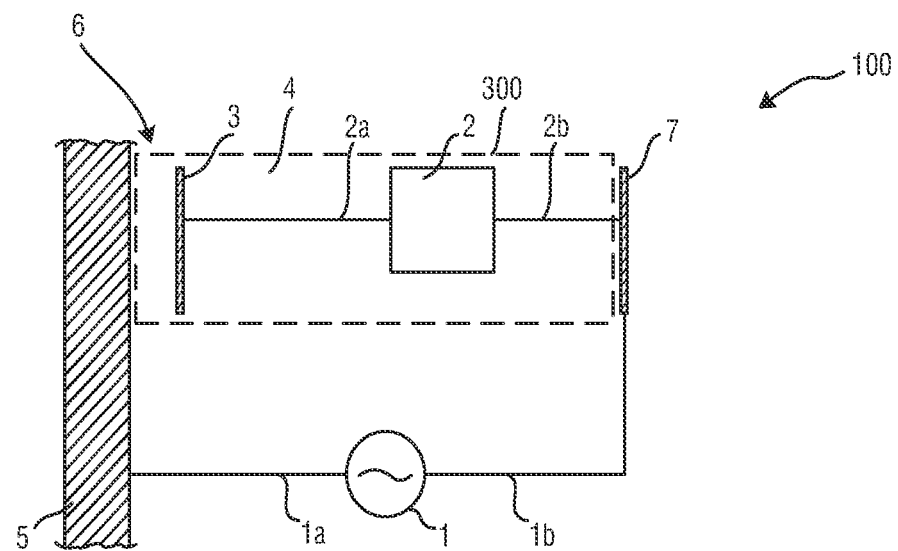
FIG. 1 shows a schematic diagram of a first embodiment of an electrical power arrangement according to the present invention.

In the following, the present invention will be explained with reference to an application scenario, in which it is used for powering of UV light sources (in particular LEDs), that may be mounted to the outer surface of a ship hull to counter bio-fouling. Hence, before the details of various embodiments of disclosed subject matter will be explained, the general idea and known approaches to counter bio-fouling in such an application scenario will be discussed.

WO 2014/188347 A1 discloses a method of anti-fouling of a surface while said surface is at least partially submersed in a liquid environment. The disclosed method comprises providing an anti-fouling light, distributing at least part of the light through an optical medium comprising a silicone material and/or UV grade (fused) silica, and emitting the anti-fouling light from the optical medium and from the surface. Such anti-fouling solutions are based on UV-C irradiation to prevent the (initial) settlement of micro- and macro organisms, for instance on a ship hull. The problem with bio-films is that as their thickness increases over time due to growth of the organisms its surface roughens. Hence, the drag increases, requiring the engine to consume more fuel to maintain the ship's cruising speed, and thus the operational costs increase. Another impact of bio-fouling can be a reduction in the cooling capacity of a pipe radiator or a flow capacity reduction of salt water intake filters and pipes. Therefore, service and maintenance costs increase.

A potential solution to counter bio-fouling of the ship hull can be the coverage of the exterior hull with slabs of for example UV-C transparent materials having embedded UV-C LED(s). These slabs, or generally any loads or load arrangement (i.e. elements or arrangements consuming electrical energy), are located below the waterline. This is because the submerged surfaces are predominantly sensitive to bio-fouling and, hence, responsible for the increase in drag. Hence, electrical power needs to be delivered under the water-line towards the loads.

The combination of electricity, water and the rough and tough environment of the off-shore industry possess a real challenge. This is because (sea) water is a good electric conductor and, hence, short circuits may easily arise. Furthermore, water decomposes under the influence of an electrical current. In the case of sea water it decomposes under DC current in chlorine and hydrogen gas. Under AC current, both gasses are formed alternatingly at each electrode. An additional problem with the gasses formed is that chlorine can enhance the already natural occurring corrosion of the steel ship hull and accelerates the degradation of other materials including the UV-C LEDs if not hermetically sealed. The hydrogen gas on the other hand can cause iron embrittlement, eventually leading to severe crack formation within the iron bulk.

To counter natural corrosion of the steel hull most ships are coated or painted and in addition often equipped with passive or active cathodic protecting systems such that the ship hull remains protected against natural corrosion when the protective coat or paint fails locally. Passive systems use sacrificial Zinc, Aluminum or Iron anodes that dissolve electro-chemically over time, whereas active systems impress a DC current in using anodes made of MMO-Ti (mix metal oxides) coated Titanium or Pt/Ti (Platinum coated Titanium). For active systems impressing a DC current into the sea water careful monitoring is required as too large currents may dissolve the hull locally at enhanced rates. Obviously, anti-fouling solutions should not render the cathodic protection system to fail. Hence, the ship's hull should act as the ground terminal, the protective currents should be DC, and the sea water may serve as a high conductivity medium closing the electric circuit.

Furthermore, ship hulls get (severely) damaged over life, for example due to natural wear, non-intentional collisions with float wood and other close or near to the surface floating objects, or they may suffer from more controlled impacts due to collisions with other ships, such as towboats or ships bound adjacent. It is therefore more than likely that also the anti-fouling loads get damaged over life as well as the power supply lines. Moreover, both loads and supply lines may get severely damaged and even get cut to yield open circuits wet by the conductive sea water. Hence, unwanted electro-chemistry may occur because of external inflicted damage. For this reason, DC power sources should not be used as the primary power source for powering the loads.

However, to operate the UV-C LEDs, DC currents are generally preferred. Hence, within the anti-fouling load, means and methods are required that can generate local DC currents when fed with AC power. More preferably, the DC current source is isolated from the steel hull (preferably serving as ground terminal). Thus, although electro-chemistry may occur when DC power terminals become exposed, the electro-chemistry will be confined to the area of exposure. Furthermore, the magnitude of the electro-chemistry will depend on the amount of DC current that can flow locally and the surface area of the electrodes exposed. Hence, there is also a need to limit the DC current near to a value as required by the UV-C LEDs (typically tenths of milli-Amperes for small LEDs) and to limit the surface area of the exposed local DC power terminals.

Hence, in practice a substantial area of the anti-fouling solution may become damaged over life. In theory, the damage can comprise local damage of one or more UV-C LEDs within one or more loads or even a large part of a load might disappear. Hence, (seamless) tiled loads are proposed in an embodiment. Within the tile some kind of sub-division of the UV-C LEDs and power source may be provided, since one failing LED (or, generally, load) should not yield the functional remainder of the tile to become non-operational on damage. Hereby, failing LEDs can yield either an open or a short circuit, and since UV-C LEDs are rather expensive, it is recommended to avoid series LED strings.

Obviously, also tiled loads will still require some kind of electrical power, either wired or wireless. Given the expected issues with a wire hassle, the off-shore industry is rough and tough, wireless power solutions are preferred and proposed by the present invention. Yet, with both the sea water and the iron hull being good electrical conductors, the power transfer losses in inductive systems as well as (RF) wireless solutions can be quite large. Besides that, they can be rather bulky. Hence, an attractive solution to provide electric power makes use of AC capacitive coupling.

Conventional capacitive (wireless) power transfer systems use one or two (long) supply wires driven by an AC oscillator. When the supply wires are covered with a dielectric film, a receiving element having two pick-up electrodes can be placed on top anywhere along the wires and power is transferred. Further, in known electrical power arrangement for powering a load the transferred power may be reactance limited. The system functions because of the well isolating properties of the ambient air. Thus, high voltage electric fields can be set-up between the two passive ground electrodes of the receiving element. However, when the ambient environment becomes conductive, as is the case for sea water, the transfer of power becomes also facilitated anywhere along the two wires by the well conducting ambient. Hence, it is very difficult to transfer any power at all towards the intended receiving element.

According to the present invention the use of a capacitive power transfer has been modified and optimized for application e.g. in electrical power arrangements for transferring power to light sources mounted to the part of a ship hull that is usually under water, i.e. in a wet, conductive and harsh ambient environment. Furthermore, the electric circuit has been adapted for robustness against moderate and severe impact as well as surface cutting damage at the various levels, such as for example UV-C LEDs developing one or more open or short-circuit connections.

FIG. 1 shows a schematic diagram of a first embodiment of an electrical power arrangement 100 according to the present invention for powering a load 2. The electrical power arrangement 100 comprises a first embodiment of a load arrangement 300 according to the present invention. The load arrangement 300 comprises a load 2 having a first load terminal 2a and a second load terminal 2b, a first electrode 3 (also called active electrode hereinafter) electrically connected to the load 2 and a dielectric layer 4. The load 2, the first electrode 3 and the dielectric layer 4 form a structure, which is configured for being arranged at a first external electrically conductive element 5. Further, the first electrode 3 and the dielectric layer 4 are arranged to form, in combination with a first external electrically conductive element 5, a capacitor 6 for capacitive transmission of electrical power between the first electrode 3 and the first external element 5. The load 2 is further connected to a second electrode 7 electrically insulated from the first electrode 3.

In this context, it shall be noted that the load 2, the first electrode 3 and the dielectric layer 4 preferably form a structure. It shall be understood that the structure may not only be formed from these elements, but that additional elements may be provided to form the structure. In some embodiments these elements themselves are configured to form the structure (e.g. the load and the first electrode dielectric layer may be embedded in dielectric material of the dielectric layer thus forming the structure). In other embodiments one or more additional elements (e.g. a carrier, a substrate, an adhesive layer, etc.) are provided to form the structure together with these three elements.

The electrical power arrangement 100 further comprises an AC power source 1 (e.g. an oscillator) having a first AC terminal 1a and a second AC terminal 1b. The first AC terminal 1a is arranged for being electrically connected to the first external element 5, i.e. after mounting and in use the first AC terminal 1a and the first external element 5 are electrically connected. The second AC terminal 2b and the second load terminal 1b are electrically connected to a second electrode 7 (also called passive electrode hereinafter). Hence, electrical power can be transmitted via the capacitor 6 from the AC power source 1 to the load. As first external element 5, elements available in the environment or infrastructure may be used, such as a hull of a vehicle, an electrically conductive floor cover and wall cover, part of building, etc. may be used.

Figure 2:
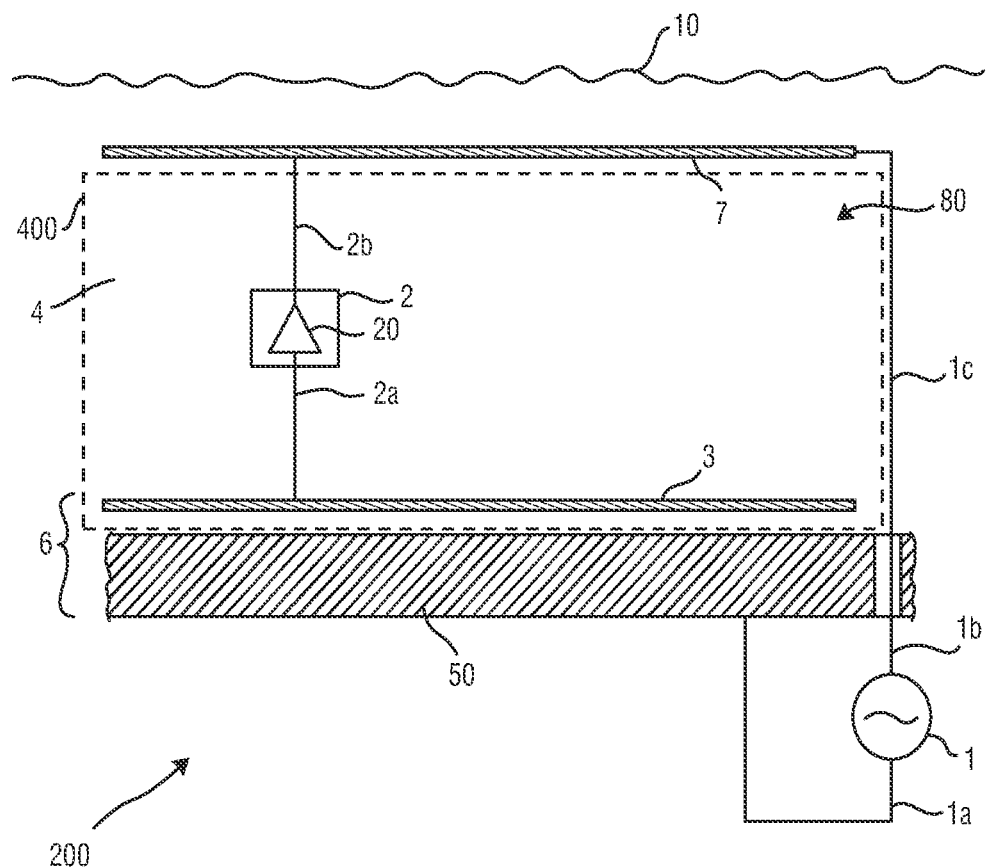
FIG. 2 shows a schematic diagram of the first embodiment of an electrical power arrangement in an anti-fouling application scenario.

FIG. 2 shows a diagram of the first embodiment of an electrical power arrangement 200 and a load arrangement 400 in an anti-fouling application scenario. In this embodiment, the load 20 is a UV-C LED and the first external element 50 is a ship hull, which is (at least partly) electrically conductive (i.e. the complete ship hull, only the inner surface, only the outer surface or only certain areas of the ship hull may be configured to be conductive or made from conductive material, e.g. a metal). The AC power source 1 is generally arranged on board of the ship. The first AC terminal 1a contacts the conductive surface of the ship hull 50, and the second AC terminal 1b is connected by a connection wire 1c through the ship hull 50 with the second electrode 7. The LED 20, the dielectric layer 4 and the first electrode 3 (optionally also the second electrode 7) are preferably carried by a carrier 80, which is arranged at the first external electrically conductive element (5, 50).

The load arrangement 400 is configured such that the electrical components are protected against the water 10 (in particular sea water). Several of such load arrangements can be coupled in parallel to the AC power source 1, i.e. the second electrodes (which may be separate electrodes or a common large second electrode) of multiple load arrangements can be coupled to the same AC power source 1 and the same connection wire 1c. In this way the number of AC power sources and connection wires can be kept small even if the number of load arrangements is large.

Figure 3:
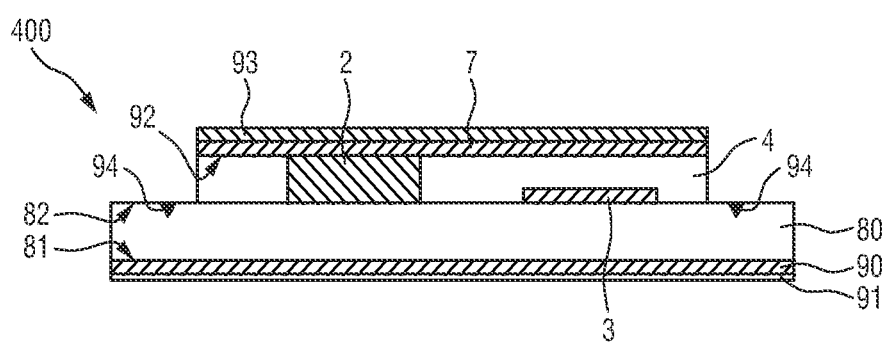
FIG. 3 shows a cross-sectional side view of a first embodiment of a load arrangement according to the present invention.

FIG. 3 shows a cross-sectional side view of an embodiment of the load arrangement 400. The carrier 80 may be a thin plate, a sheet or substrate, made e.g. of a material (preferably fulfilling the above described requirements) resistant against the environment in which it is used. Preferably, the carrier 80 is flexible to be able to arrange it to different elements 5, e.g. to curve surfaces like a ship hull. The dielectric layer 4 is provided on top of the carrier 80, and the load 2 is embedded into the dielectric layer 4. Further, the first electrode 3 is provided embedded in the dielectric layer 4. The electric load terminal 2b can be embedded in, sit on top of or even stick out of the dielectric layer 4. The second electrode 7 is provided on top of the dielectric layer 4.

For enabling arrangement of the being arranged at the first external electrically conductive element 5, e.g. the ship hull 50, in a simple manner, an adhesive material 90 may be provided on one surface 81 of the carrier 80. The adhesive material 90 may further be covered a removable film 91 as protection of the adhesive material 81 before application of the carrier 80 to the element 5.

Instead of adhesives which have a chemical base for fixation, hot melt (thermoplastic material, rigid when cold, once heated for example via steam, becomes a fluid locally for a short time and ensures the connection) or mechanical anchoring (micro hooks of two materials that engage during binding) or a combination of these can be used.

Further, the size and/or form of the carrier 80 may be made to match the form and/or size of an area of application. For instance, the load arrangement may be configured as a kind of tile or sticker, which is designed to match the form and/or size of the element 5 or such that several of such stickers or tiles can be combined (placed adjacent to each other) to cover the desired area of the element 5 in an easy manner.

Preferably, the surface 82 of the carrier 80 and/or the outer surface 92 of the load arrangement opposite to the surface 81 of the carrier covered with the adhesive material is covered with an adhesive material 93, in particular for receiving a light guide or dithering surface on one of the surfaces.

The carrier 80 may further comprise an indicator 94 for installation of the load arrangement, in particular for indicating the installation position and/or installation direction and/or overlap possibility. Such an indicator may simply be a dotted line or a cutting line or any graphic that shows how and where to apply the carrier to the element 5.

Multiple load arrangements may be provided as a roll so that single load arrangements can be taken from said roll and applied as desired, or a whole sequence of load arrangements can be used and applied simultaneously.

Figure 4:
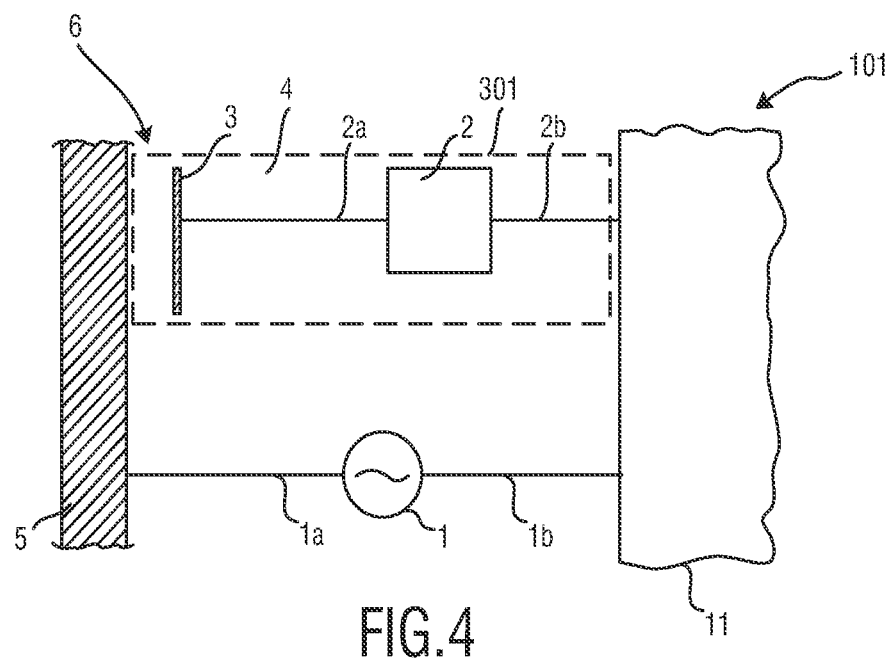
FIG. 4 shows a schematic diagram of a second embodiment of an electrical power arrangement according to the present invention.
Figure 5:
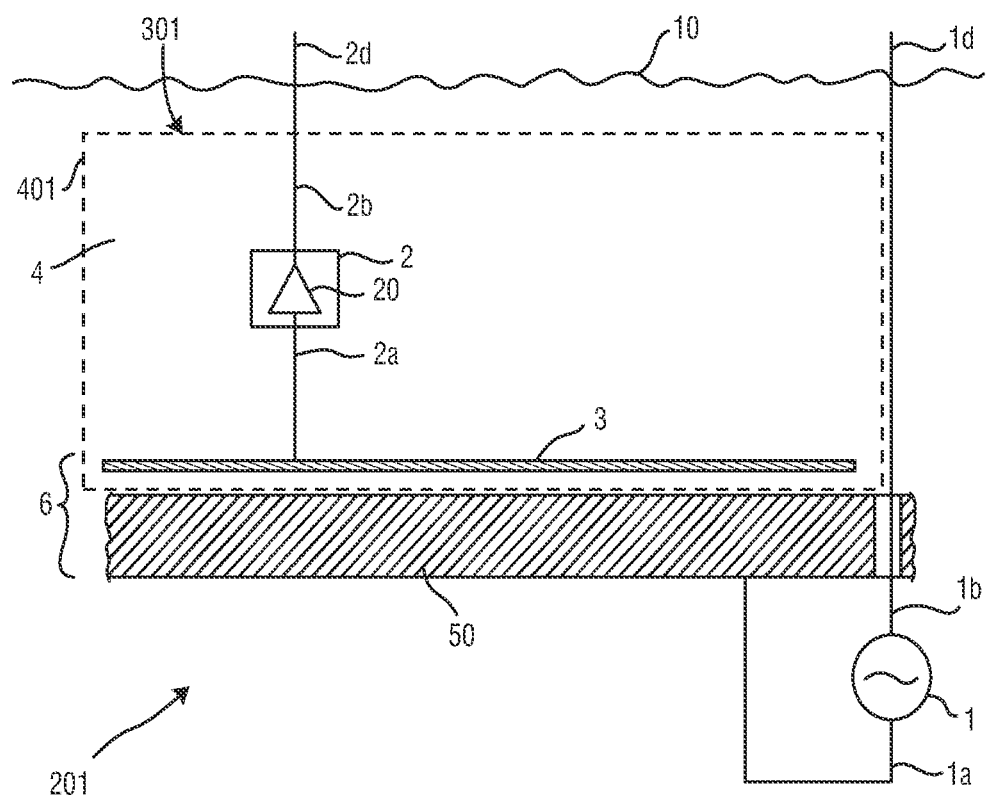
FIG. 5 shows a schematic diagram of the second embodiment of an electrical power arrangement in an anti-fouling application scenario.

FIG. 4 shows a schematic diagram of a second embodiment of an electrical power arrangement 101 including a second embodiment of a load arrangement 301 according to the present invention, and FIG. 5 shows a schematic diagram of said second embodiment of the electrical power arrangement 201 including the second embodiment of the load arrangement 401 in an anti-fouling application scenario. Different from the first embodiment, the second embodiment does not make use of a second electrode, but the second AC terminal 1b and the second load terminal 2b are electrically connected to a second external electrically conductive element 11 insulated from the first external element 5, in particular by wires 1d and 2d. In the application scenario depicted in FIG. 5 the second external element 11 is preferably the water 10, in particular sea water, through which the current path is closed between the second AC terminal 1b and the second load terminal 2b, which has the advantage that no extra wire electrode 7 is required as in the first embodiment. The wires 1d and 2d just need to be guided into the water 10. The load arrangement 301/401 is preferably configured in a modular way. Like in the first embodiment the load arrangement 301/401 preferably comprises a carrier (not shown in FIGS. 4 and 5). As the current is transmitted via water instead of wiring there will be ease of installation, cost reduction and flexibility. Further, the modularity also allows for freedom of placement.

Figure 6:
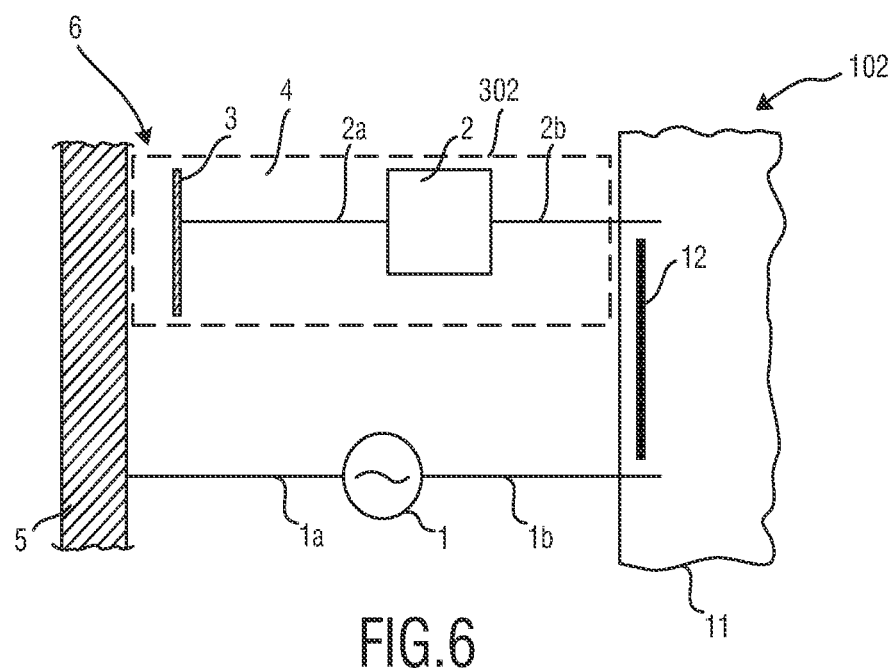
FIG. 6 shows a schematic diagram of a third embodiment of an electrical power arrangement according to the present invention.
Figure 7:
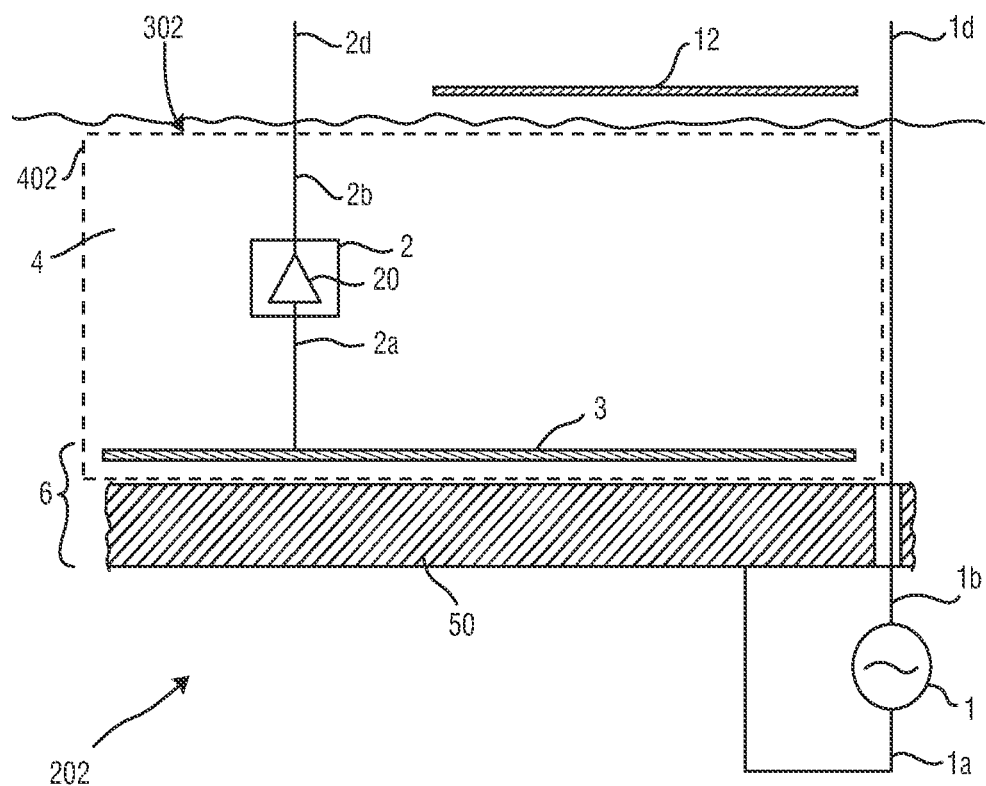
FIG. 7 shows a schematic diagram of the third embodiment of an electrical power arrangement in an anti-fouling application scenario.

FIG. 6 shows a schematic diagram of a third embodiment of an electrical power arrangement 102 including a third embodiment of a load arrangement 302 according to the present invention, and FIG. 7 shows a schematic diagram of the third embodiment of the electrical power arrangement 202 including the third embodiment of the load arrangement 402 in an anti-fouling application scenario. Compared to the second embodiment, the third embodiment additionally comprises an electrically conductive current guidance member 12 arranged within or attached to the second external element 11 and between the second AC terminal 1b and the second load terminal 2b, without having galvanic contact with them. This current guidance member 12 may e.g. be an extra electrode (e.g. a plate or wire) arranged within the water 10 to lower the impedance of the current path between the second AC terminal 1b and the second load terminal 2b. Again, the load arrangement 302 is preferably configured in a modular way. The guidance member 12 may also sit on top of the modular sticker assembly in the form of a wire or a loop, or it can even be an extension of the wire 2d. Thus the distance between adjacent loops is made by local sea water bridges (alternating chain of guidance members and sea water bridges).

Further, for the wire 1d a (often already existing) DC power line may be used. Such a DC power line is generally arranged within or attached to the second external element, i.e. is guided into the water, to reduce or avoid natural corrosion of the ship hull. This DC power line 1d may thus be reused and electrically connected to the second AC terminal 1b to impress the AC current in addition to the DC current. This avoids the need of additional wires and of additional bores through the ship hull.

FIG. 8 shows a schematic diagram of a fourth embodiment of an electrical power arrangement 203 including fourth embodiment of a load arrangement 403 according to the present invention in an anti-fouling application scenario. Compared to the first embodiment the load 2 comprises two anti-parallel coupled LEDs 20a, 20b coupled between the first electrode 3 and the second electrode 7. This provides that they are alternately emitting light in the respective half period of the AC current wave.

FIG. 9 shows a schematic diagram of the fifth embodiment of an electrical power arrangement 204 including fourth embodiment of a load arrangement 404 according to the present invention in an anti-fouling application scenario. In this embodiment the load 2 comprises a diode bridge 23 (also called Graetz bridge or Graetz circuit) of four Schottky diodes and an LED 24 coupled between the midpoints 23a, 23b of the diode bridge. The diode bridge 23 serves as rectifier for rectifying the coupled AC current so that the LED 24 is illuminating in both half periods of the AC current.

FIG. 10 shows a schematic diagram of a sixth embodiment of an electrical power arrangement 105 including a plurality of load arrangements 305a, 305b, 305c according to the present invention, and FIG. 11 shows a schematic diagram of the sixth embodiment of the electrical power arrangement 205 in an anti-fouling application scenario comprising the plurality of load arrangements 405a, 405b, 405c. The load 2 thus comprises a plurality of loads 25a, 25b, 25c (also called sub-loads), whose first load terminals are coupled in parallel to a common first electrode 3 and whose second load terminals are coupled in parallel to separate second electrodes 7a, 7b, 7c (i.e. a segmented second electrode as shown in FIG. 10) or the second external element (not shown). Each of the loads 25a, 25b, 25c may thereby be configured as shown in any one of FIGS. 1 to 9.

Unlike conventional solutions, the loads 25a, 25b, 25c are connected directly in parallel with the AC power source 1 and are terminated by a passive ground electrode (i.e. the second electrode(s) 7 or 7a, 7b, 7c), rather than using two active transfer electrodes in between the AC power source 1 and the load 2. Also in this configuration the local current is reactance limited by the surface area of the passive electrode, and, hence, the local DC current that can flow through, for example, a short-circuit (LED).

For low resistivity electrodes, the effective current I is described by $I_{subload}=U_{oscillator}*2*p*f*C$, where U is the effective (oscillator) voltage and f the driving frequency. The value of the local capacitance C depends on the local area of the segmented passive electrode 7a, 7b, 7c, the local thickness of the dielectric layer 4 (or 4a,4b,4c) in between the electrode 7a, 7b, 7c and the common electrode (hull) 5 and the permittivity thereof. Since, the current I depends on the applied drive voltage U, it may be understood that the power P transfer capability, even if the electrical power arrangement is very efficient, is reactance limited, given by $P_{eff}=U_{eff}*I_{eff}$. Thus to transfer a lot of power, high voltage and/or large capacitance is required. For the sake of safety, it may be clear that large capacitance is preferred. Since ship hulls provide a large surface area and UV-C LEDs are low-power, this can be used according to the desired application scenario. Hence, also from the perspective of LED power it is beneficial to deploy a plurality of local (DC) power sources fed by a single (AC) supply line.

Beneficially, the dielectric material can be used to embed the LEDs within a UV-C transparent, water and salt impermeable enclosure, i.e. all the elements may be accommodated within housing and can additionally or alternatively be embedded in dielectric material, which may be the same material as used for the dielectric layer 4. A suitable embedding material that is well UV-C transparent is silicone. In addition, since the area of the local passive electrode (the second electrode 7) and the local dielectric material thickness are design parameter, even LEDs and other electronics requiring different current and/or voltage levels can still be connected to one and the same oscillator. Beneficially, the use of a single drive line reduces the problem of a wire hassle since any wire is allowed to be connected to any other wire. This eases the installation, in particular in the off-shore industry.

Figure 12A:
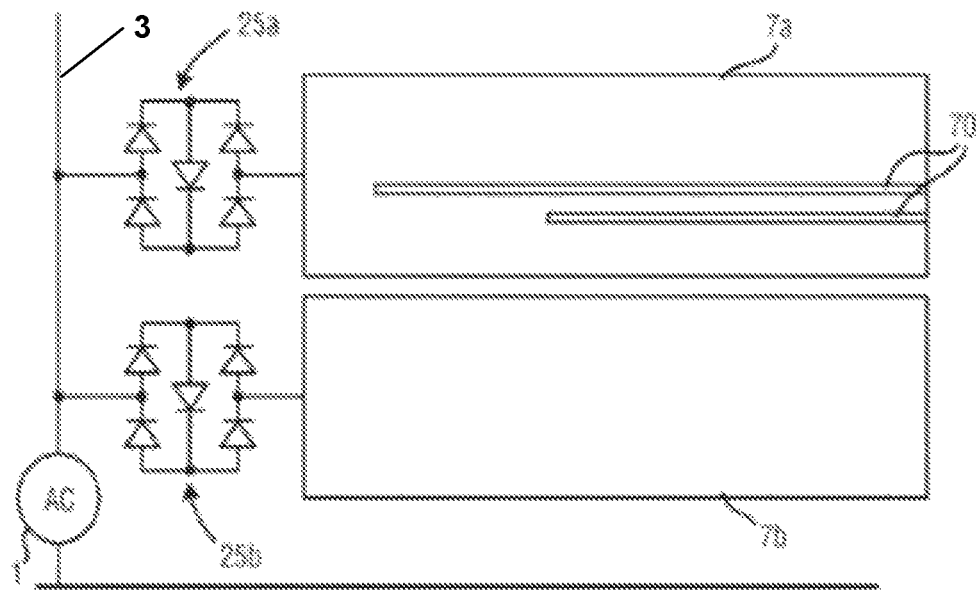
FIG. 12A shows a diagram of a locally cut segmented second electrode.

It can be deduced from the formula given above that the area of the passive electrode can be minimized in deploying higher driving frequencies, thereby potentially limiting the area/volume of the vulnerable electronics. For a large effective sub-load current (i.e. current through one of a plurality of loads 25a, 25b, 25c, as e.g. shown in FIGS. 10 and 11) to flow, however, the surface area of the passive electrode will still have a certain size. Fortunately, it does not matter if the area becomes cut on damage, in that a cut will hardly reduce its surface area. This is illustrated in FIG. 12A showing a diagram of a locally cut segmented second electrode 7b as used in an embodiment of the electrical power arrangement, wherein the cuts 70 have hardly any impact on the effective passive electrode area.

Figure 12B:
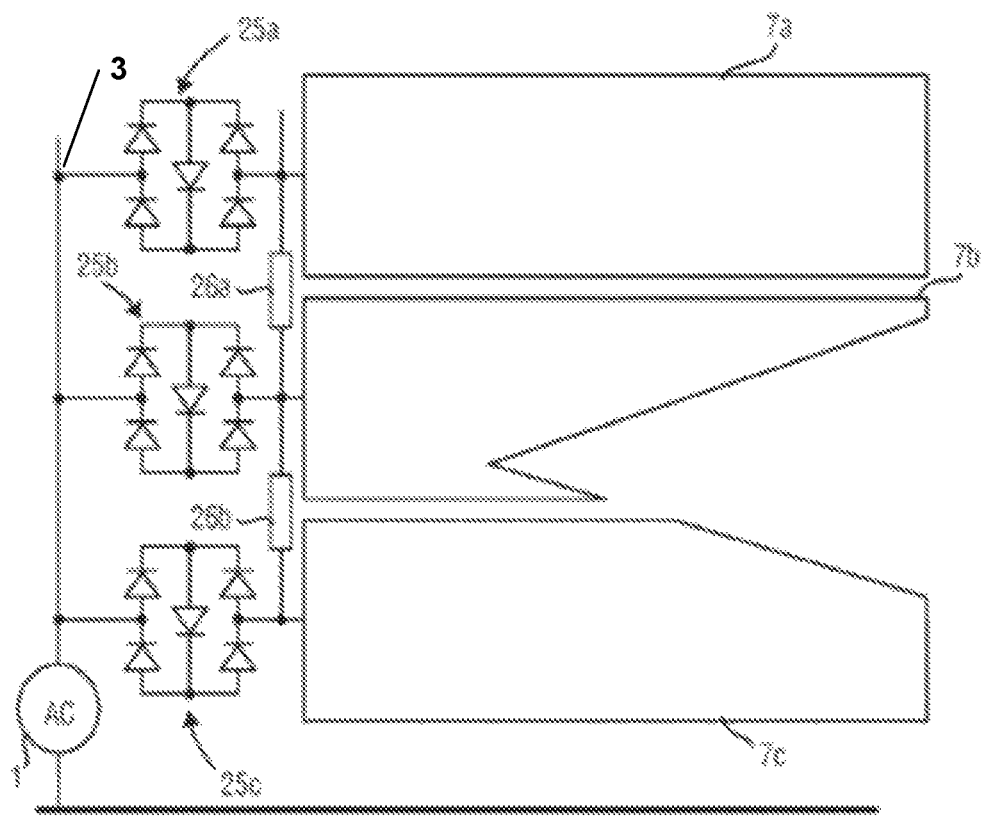
FIG. 12B shows a diagram of a damaged segmented second electrode.

Only if the surface area of the passive electrode is reduced, as illustrated in FIG. 12B showing a diagram of damaged segmented second electrodes 7b, 7c, the LED output of the LED in the sub-loads 25b, 25c becomes reduced, which is undesired. Hence, for a substantially damaged passive electrode area, the area is affected significantly. In deploying load share resistors, part of the area loss can be compensated for by the nearest neighbors, with the value of R determining how many and to what extent (functional, open or short-circuit) neighbors can compensate for the experienced area loss.

To cope with passive electrode damage, load share resistors 26a, 26b may be deployed connecting one or more adjacent passive sub-electrodes 7a, 7b, 7c in parallel, as also illustrated in FIG. 12B. One benefit of the load-share resistors 26a, 26b is that in the undamaged case significant differences between adjacent sub-electrodes 7a, 7b, 7c do not exist and, hence, there is hardly any power dissipation in the load share resistor 26a, 26b. When there is damage, part of the damaged LED current can be carried by the neighboring sub-electrodes 7a, 7b, 7c. How much sharing is possible depends on the value of the load share resistor 26a, 26b. For a low value of the load share resistor 26a, 26b, a substantial fraction of passive electrode area is allowed to be missing. However, if one or more of the neighbors also develop a short-circuit, a too large short-circuit current can flow. When the value of the load share resistor 26a, 26b is too high, there is hardly any missing electrode compensation possible. Hence, a fair load sharing capacity of 10-40% is estimated to be a reasonable value. In the case of a 20 mA UV-C LED current, load share resistor values of about 1-4 kΩ are reasonable, but the value is not limited to this range.

As discussed above, if the area of the local active electrode (i.e. the first electrode) is designed to allow for a maximum current with a value equal or near to that of the UV-C LED, sub-loads are allowed to develop a short-circuit without significantly affecting their functional neighbors (with or without load share resistor). Consequently, in case both the positive and the negative terminal of a local DC power source become exposed upon damage, also the magnitude of the electro-chemical current is limited, whereas its location is confined to the area of damage. Since the exposed terminals will dissolve over time, the amount of electro-chemistry will also reduce over time if not stopped in full because of material dissolution.

Satisfactory results may e.g. be obtained for drive frequencies ranging between 0.1 and 100 MHz. AC electro-chemistry takes place and corrosion will form, for example when the supply wire 1b is cut. Damage control is therefore required. Here another benefit of a high oscillator frequency (>~20 kHz) exists. If the supply wire 1b (power supply wire supplies AC power and hence induces AC electro-chemistry; within the load AC is converted to DC, and DC electro-chemistry takes place, but only locally) is exposed towards the sea water, the supply wire and the hull will act as alternatingly anode and cathode. For high frequencies this is not different, yet, for both electrodes the waste products of the electro-chemistry will be available at each electrode and in stoichiometric amounts for a symmetric drive voltage. More importantly, due to formation kinetics of the gas bubbles, the bubbles will still be small-sized before the polarity reverses. Hence, auto-ignition and thus self-annihilation takes place. This process generates heat, but the amount of free waste products is reduced dramatically.

Another benefit of the proposed solution is that the closing of the electric circuit is done by means of the passive electrode area in series with either the well conductive sea water below the water line or non-conductive air above the water line. Hence, the loads above the waterline self-dim. Besides the conductivity, also the dielectric constants above and below the waterline are different with again the resulting effect working in the right direction. Loads above the water line can thus be made to dim passively, depending on the coupling ratio towards the ship hull and the ambient sea water/air, thereby saving energy and, at the same time, reducing the amount of UV-C radiated into the ambient environment above the water line. If required the LEDs can even be turned off in full by deploying an active detection circuit. Different embodiments describe the different means and methods to achieve this (e.g. using different dielectric thicknesses, different materials, two level passive electrodes, a detour hole toward the hull that may wet or not, etc.).

According to one aspect of the present invention all loads are connected in series with the oscillator (AC power source), terminated by a passive ground. An advantage of this setup is that all the current flowing from the passive electrode to ground also flows through the sum of sub-loads. The efficiency or power transfer of this setup is determined by the ratio of the energy consumed by all the sub-loads and that dissipated (in series with the loads) by the ambient environment at the passive ground electrode. When the ambient environment is well conducting (low series resistivity), which is the case for sea water and the ship hull, the power losses are low. This is because the ship hull is thick, has a large surface area and is made of well electrically well conducting steel, whereas the resistive losses of the sea water are small because of its rather high conductivity. In fact, the ship hull is floating in an infinite, liquid array of 3D resistors. Moreover, all resistive paths to ground are in parallel, yielding a very low effective resistance. Above all, this resistance is self-adapting in that the sea water follows the contours of the ship hull either in movement or stationary as well as that it adapts to differences in the waterline due to variations in load (cargo/ballast water or both). Thus, under all circumstances the efficiency of the proposed electrical power arrangement is high and optimal.

Given the expected low-loss contributions of the ship hull and sea water, the dielectric properties of the dielectric layer on top of the segmented passive electrodes are, hence, most important. The loss related to this layer can be very low when for example silicone is used. The use of silicones is furthermore beneficial as it is UV-C transparent and water and salt blocking.

Another aspect of the present invention relates to the potential cutting of the common power line (i.e. the supply wire $1b$) and subsequent exposure to the sea water. Although such cutting will render the loads connected down-stream to become inoperative, the amount of power dumped into the sea water and the time that such dumping takes place can be minimized. This can be done on optimizing its physical dimensions as well as its rate of erosion on exposure. The common power line is therefore preferably executed as a thin and wide strip, rather than executing it as a thick round wire. In addition, ductile materials may be used, such as gold, silver, copper and aluminum that can be cut and torn easily. Of these materials, aluminum is the most preferred material, as aluminum will also dissolve in both acidic and basic environments. Thus, when electro-chemistry takes place aluminum will dissolve much faster than most other materials, while it is still a good electrical conductor. In addition, chlorine gas and ions both accelerate the dissolution of aluminum already by nature. Hence, the surface area of the exposed strip or cross-section will be reduced rapidly, thereby rapidly decreasing the amount of power dumped toward the ambient sea water.

Furthermore, aluminum has a low melting point, allowing for the integration of one or more fuses into the power line itself. Beneficially, aluminum is also a very good reflector for UV-C. Thus, both power line and passive electrodes are preferably executed in (sheet) aluminum. Furthermore, aluminum allows for the (wire) bonding of electronic components without the need for solder, and it can be laser welded. Hence, the full integration of all the electronic components into an UV-C LED strip, also having passive segmented electrodes is possible. In addition, LEDs strips can be easily adhered to curved and contoured surfaces and can be made in long lengths. An LED strip or LED sticker may hence be used in an embodiment. Furthermore, the thickness of the sticker carrier can be easily controlled over large areas and lengths, and hence, the capacitance to the hull can be set with little effort (area of the electrodes 3 and 7 patterned directly on top of the carrier).

If an LED strip or LED sticker is used having only a single power supply wire, the remainder of the anti-fouling tile (i.e. of the load arrangement) may comprise a "passive" tiling, comprising only an UV-C light guide, optically connected to the LED strip. This can be a snap over tile (light guide goes over LED strip), or be a slab of light guiding material filling the gap between adjacent LED strips, or comprise a plurality of smaller tiles filling the space in between LED strips. The advantage is that the light guides can be cut to measure to fill the gap without damaging the LED strips. The optical coupling between the light guiding members and LED strips can be executed as air, (sea) water or silicone.

Generally, the connection wire $1c$ may be directly (galvanically) connected to the second electrode 7 or may end in the water so that the connection between the connection wire $1c$ and the second electrode 7 is made through the water, which is particularly useful In case of use a sticker-type solution of the load arrangement. These different solutions shall be indicated by the dotted line between the end of the connection wire 3 and the second electrode 7 (particularly in FIGS. 8 and 9). Further, the second electrode 7 is preferably directly connected to the load 2, i.e. there is generally no (long) connection between the load terminal $2b$ and the second electrode 7.

In the following further embodiments will be described.

Figure 13A:
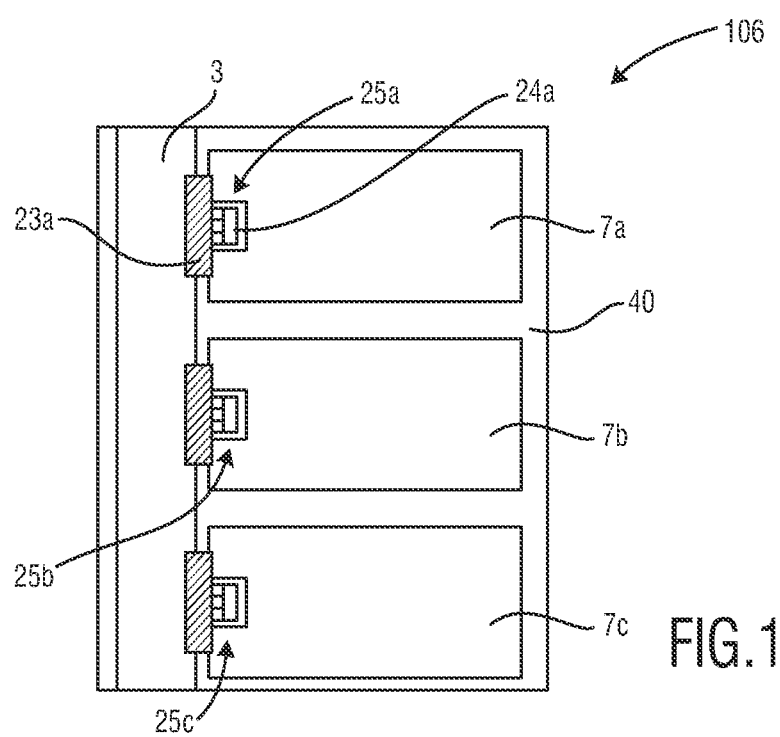
FIG. 13A shows a side view of a practical implementation of an electrical power arrangement according to the present invention in an anti-fouling application scenario.
Figure 13B:
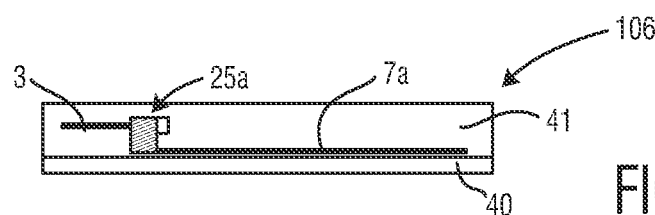
FIG. 13B shows a top view of a practical implementation of an electrical power arrangement according to the present invention in an anti-fouling application scenario.

FIG. 13 shows a side view (FIG. 13A) and a top view (FIG. 13B) of a practical implementation of an electrical power arrangement 106 according to the present invention in an anti-fouling application scenario, which is similar to the sixth embodiment depicted in FIGS. 10 and 11. In this embodiment a single, thin and wide conductive power supply wire 3 (representing the first electrode) carried on top of one or more dielectric (adhesive) substrates 40 (part of which representing the dielectric layer 4) is provided, with the single supply wire 3 (being connect to the AC terminal $1b$ directly or by external member 11 (sea water)) preferably being executed in sheet aluminum and being voltage modulated by a high frequency AC oscillator (not shown). The single supply wire 3 is galvanically connected to a plurality of loads 25a, 25b, 25c connected in parallel, including for example local DC power sources executed in the form of a Graetz bridge 23 and LEDs 24 as shown in FIG. 9 or 12. Each load 25a, 25b, 25c is terminated by a current limiting passive ground electrode 7a, 7b, 7c.

Across the Graetz bridge 23 of every load 25a, 25b, 25c there may be one or more electronic components connected, such as (UV-C) LEDs, ICs and/or other electronic circuits and modules. Preferably, the whole assembly is enclosed in a UV-C transparent, water and salt impermeable enclosure 41, e.g. made of silicone.

Figure 14:
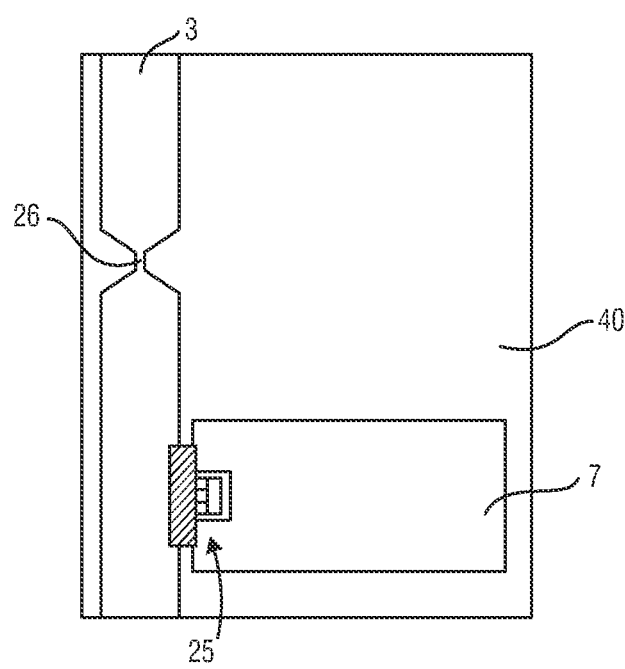
FIG. 14 shows a side view of another practical implementation of an electrical power arrangement according to the present invention in an anti-fouling application scenario.

The supply wire 3 (representing the first electrode) may be provided with one or more integrated fuses 26 (e.g. executed in sheet aluminum) and a water tight, insulated attachment of the power supply wire. The fuse provides safety in case of wire damage. This is illustrated in FIG. 14 showing a top view of another practical implementation of an electrical power arrangement 107 according to the present invention in an anti-fouling application scenario.

In another embodiment the passive electrode areas 7a, 7b, 7c may also be executed in sheet aluminum. Further, the passive electrode areas may be executed such that multiple capacitance values can be obtained, depending on the electric and dielectric properties of the ambient environment. For example, different thicknesses of the dielectric at the top and the bottom side of the passive electrode, or two different dielectric materials (e.g. one sticks well and the other having a better UV transparency), or a locally thinned dielectric material on top in form of a hole that can be wet sea water, may be deployed. Another example is a passive electrode split in two or more connected sub-parts, with one or more part raised in plane when compared to the other part close to the carrier substrate. Further, the reverse of these options described above may be used. Yet another embodiment may comprise an inflatable or flapping passive electrode or a cavity below or on top of a passive electrode, allowing for local height and/or dielectric material adjustment. These are just examples of options that can be used to tune the individual contributions of the upper and low half of the passive ground electrode with the aim to auto-dim the local LEDs depending on the dielectric and electric properties of the ambient environment.

Figure 15:
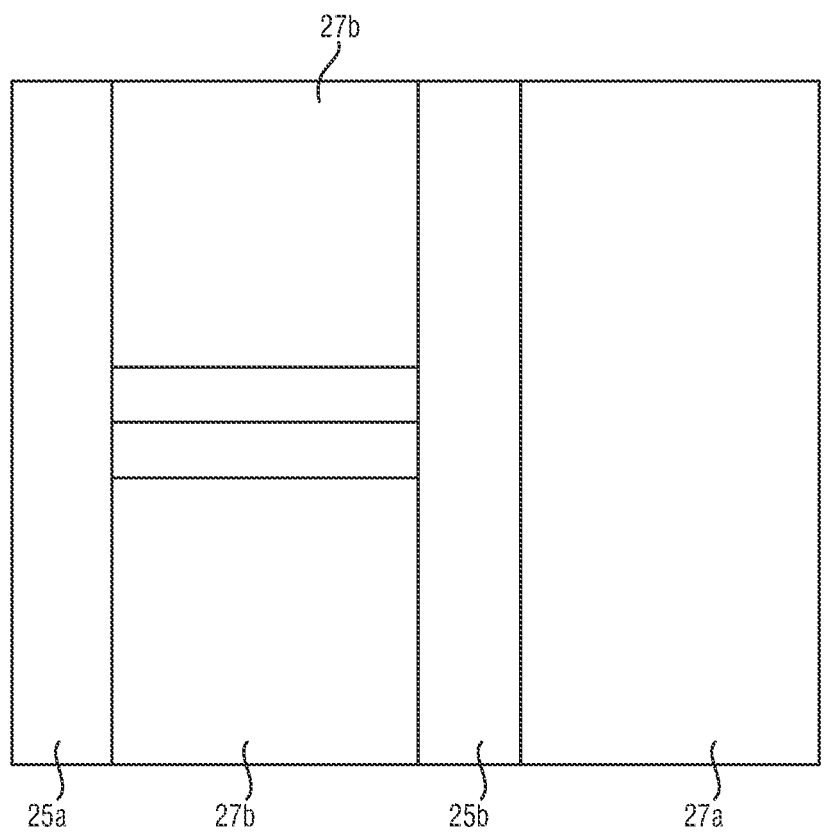
FIG. 15 shows examples of the combination of an active UV-C LED strip and an add-on passive UV-C light guide executed as a roll, tile or strip.

In still another embodiment the LED strip 25a, 25b may be optically extendable by an add-on light guide, for example executed as a roll 27a, a tile 27b or any other shaped extendable, yet, passive UV-C light guide as illustrated in FIG. 15. Such tiles can be damaged and/or lost on impact and be replaced as easily as required.

Other applications than the use at an external surface of a ship hull include buildings under water, such as a pier, pile of a bridge or wind power plant, etc.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

It follows a list of further embodiments and aspects:
C1. A marine structure comprising:
  a surface (50) and
  a load (2, 20, 21, 22, 25) having a first load terminal (2a) and a second load terminal (2b) for being powered by an AC power source (1), said AC power source (1) having a first AC terminal (la) electrically connectable to the surface (50) and a second AC terminal (1b),
  a first electrode (3) electrically connected to the first load terminal (2a), and
  a dielectric layer (4),
wherein the first electrode (3) and the dielectric layer (4) are arranged to form, in combination with the surface (50), a capacitor (6) for capacitive transmission of electrical power between the first electrode (3) and the surface (50),
wherein the second AC terminal (1b) and the second load terminal (2b) are arranged for being electrically connected to a second external electrically conductive element (10, 11) insulated from the surface (50), and
wherein the first load terminal (2a) is electrically insulated from the second load terminal (2b).
C2. The marine structure as defined in embodiment C1, wherein the surface (50) is an external surface.
C3. The marine structure as defined in embodiment C2, wherein the surface (50) is at least part of a ship hull.
C4. The marine structure as defined in embodiment C1, further comprising an AC power source (1) for powering said load.
C5. The marine structure as defined in embodiment C1, further comprising a carrier (80) carrying the load (2), the first electrode (3) and the dielectric layer (4) and being configured for being arranged at the ship hull (50).
C6. The marine structure as defined in embodiment C1, further comprising a second electrode (7) electrically connected to the load (2) and being arranged for being electrically connected to an AC power source (1).
C7. The marine structure as defined in embodiment C1, wherein the load (2) is arranged for being electrically connected to the second external electrically conductive element (10, 11), which is water, in particular sea water.
C8. The marine structure as defined in embodiment C1, further comprising an electrically conductive current guidance member (12) arranged within or attached to the second external element (10, 11) and the load terminal (2).
C9. The marine structure as defined in embodiment C1, further comprising a DC power line (1d) arranged within or attached to the second external element (10).
C10. The marine structure as defined in embodiment C1, further comprising a housing (8) accommodating the load (2, 20, 21, 22), the first electrode (3) and the dielectric layer (4).
C11. The marine structure as defined in embodiment C1, comprising a plurality of loads (25a, 25b, 25c), whose first load terminals are coupled in parallel to a common first electrode (3) or separate first electrodes (3a, 3b, 3c) and whose second load terminals are coupled in parallel to a common second electrode (7), separate second electrodes (7a, 7b, 7c) or the second external element (10, 11).
C12. The marine structure as defined in embodiment C1, wherein the load (20, 21, 22) comprises a light source, in particular an LED or an UV-LED.
C13. The marine structure as defined in embodiment C12, wherein the load (22) comprises a diode bridge circuit (23), wherein the light source (24) is coupled between the midpoints (23a, 23b) of the diode bridge circuit (23).
C14. The marine structure as defined in embodiment C1, wherein the load (21) comprises a first LED (21a) and a second LED (21b) coupled anti-parallel to each other.
C15. The marine structure as defined in embodiment C5, wherein the ship hull (50) is covered by a plurality of carriers (80) and wherein a plurality of AC power sources (1) are provided, each being configured for powering the loads of two or more carriers (3).

A1. A load arrangement for use in an electrical power arrangement and for arrangement at a first external electrically conductive element (5, 50), said load arrangement comprising:
  a load (2, 20, 21, 22, 25) having a first load terminal (2a) and a second load terminal (2b) for being powered by an AC power source (1),
  a first electrode (3) electrically connected to the first load terminal (2a), and
  a dielectric layer (4),
wherein the first electrode (3) and the dielectric layer (4) are arranged to form, in combination with a first external electrically conductive element (5, 50), a capacitor (6) for capacitive transmission of electrical power between the first electrode (3) and the first external element (5, 50),
wherein at least one of the capacitor (6) and the second load terminal (2b) is arranged for electrical power transmission through water (10, 11) to form an electrical path via the water (10, 11) between the AC power source (1) and the respective one of the capacitor and the second load terminal (2b), and wherein the first load terminal (2a) is electrically insulated from the second load terminal (2b).

A2. The load arrangement as defined in embodiment A1, wherein the first external electrically conductive element (5, 50) is selected from the group of electrically conductive elements comprising water, in particular sea water, an environmental object, in particular a part of a building or vehicle, and an infrastructural object.

A3. The load arrangement as defined in embodiment A1, wherein the first external electrically conductive element (5, 50) is a marine structure and wherein the second load terminal (2b) has an electrical connection to water (10, 11) to form an electrical path via the water (10, 11) between the AC power source (1) and the second load terminal (2b) and wherein the AC power source (1) is attached to the marine structure (5) and the AC power source (1) has an electrical connection to water (10, 11) to complete the electrical path via the water (10, 11) between the AC power source (1) and the second load terminal (2b).

A4. The load arrangement as defined in embodiment A3, wherein the second load terminal (2b) and the AC power source (1) have a capacitive electrical connection to water (10, 11).

A5. The load arrangement as defined in embodiment A3, wherein the second load terminal (2b) and the AC power source (1) have a resistive electrical connection to water (10, 11).

A6. The load arrangement as defined in embodiment A1, wherein the first external electrically conductive element (5, 50) is water and wherein the capacitor is arranged for electrical power transmission through water (10, 11) to form an electrical path via the water (10, 11) between the AC power source (1) and the capacitor.

A7. The load arrangement as defined in embodiment A1, further comprising an electrically conductive current guidance member (12) for being arranged within or attached to the second external element (10, 11) and the load (2) for lowering the resistance in the conductive path of the load arrangement.

A8. The load arrangement as defined in embodiment A7, wherein the guidance member (12) is configured to be arranged within said water (10, 11) and/or attached to the load arrangement.

A9. The load arrangement as defined in embodiment A1, comprising a plurality of loads (25a, 25b, 25c), whose first load terminals are coupled in parallel to a common first electrode (3) or separate first electrodes (3a, 3b, 3c) and whose second load terminals are coupled in parallel to a common second electrode (7), separate second electrodes (7a, 7b, 7c) or said water (10, 11).

A10. The load arrangement as defined in embodiment A3, wherein the first external element (5) is a ship hull.

A11. The load arrangement as defined in embodiment A3, wherein the first external element (5) is an electrode embedded or connected to a non-conductive marine structure.

A12. The load arrangement as defined in embodiment A1, wherein the load (20, 21, 22) comprises a light source, in particular an LED or an UV-LED or including a first LED (21a) and a second LED (21b) coupled anti-parallel to each other.

A13. The load arrangement as defined in embodiment A1, wherein the load (22) comprises a diode bridge circuit (23), wherein the light source (24) is coupled between the midpoints (23a, 23b) of the diode bridge circuit (23).

A14. An electrical power arrangement for powering a load, said electrical power arrangement comprising:
an AC power source (1) and
a load arrangement as defined in any one of embodiments A1 to A13.

A15. A system comprising:
a load arrangement as defined in any one of embodiments A1 to A13,
an impressed current cathodic protection, ICCP, system and
a control unit for controlling said load arrangement and said ICCP system to work in combination.

A16. A marine structure having an outer surface comprising a load arrangement as claimed in any one of embodiments A1 to A13, wherein the load arrangement is attached to the said outer surface.

A17. A method for installing a load arrangement as defined in any one of embodiments A1 to A13 to an outer surface of a marine structure.

A18. Use of a load arrangement as defined in any one of embodiments A1 to A13 for installation to an outer surface of a marine structure, in particular to counter bio-fouling of the outer surface.

The invention claimed is:

1. An anti-fouling device comprising:
   an electric circuit,
      wherein the electric circuit comprises a load that receives power from a power source that is external to the anti-fouling device,
      wherein the load comprises a plurality of UV-C LEDs; and
   an add-on light guide,
   wherein the add-on light guide is configured to optically extend light output of the plurality of UV-C LEDs,
   wherein the add-on light guide comprises a UV-C light guide,
   wherein no UV-C light is generated within the UV-C light guide,
   wherein the UV-C light guide is configured to be optically coupled to the plurality of UV-C LEDs, and
   wherein the electric circuit has only a single power supply wire that receives the power from the power source.

2. The anti-fouling device of claim 1, wherein the add-on light guide is executed as a roll, tile or strip.

3. The anti-fouling device of claim 1, wherein the add-on light guide covers the plurality of UV-C LEDs.

4. The anti-fouling device of claim 1, wherein an optical coupling between the plurality of UV-C LEDs and the add-on light guide is via air, water, seawater, or silicone.

5. An anti-fouling device comprising:
   an electric circuit,
      wherein the electric circuit comprises a load,
      wherein the load comprises a plurality of UV-C LEDs; and
   an add-on light guide,
   wherein the add-on light guide is configured to optically extend light output of the plurality of UV-C LEDs,
   wherein the add-on light guide comprises a UV-C light guide,
   wherein the UV-C light guide is configured to be optically coupled to the plurality of UV-C LEDs,
   wherein no UV-C light is generated within the UV-C light guide,
   wherein the electric circuit has only a single power supply wire, wherein the plurality of UV-C LEDs and the add-on light guide are configured for placement on an outer surface of a marine structure,
wherein the outer surface is an electrically conductive element,
wherein the electric circuit further comprises a first electrode that is electrically connected to the load,
wherein the first electrode is insulated from the outer surface,
wherein the first electrode and the outer surface form a capacitor,
wherein the capacitor is configured for capacitive transmission of electrical power between the first electrode and the outer surface,
wherein the load is connected to a second electrode,
wherein the second electrode is coupled to the single power supply wire.

6. An electrical power arrangement comprising:
the anti-fouling device of claim 1;
a conductive surface that is insulated from the anti-fouling device and
an AC power source,
wherein the AC power source is coupled to the single power supply line and to the conductive surface.

7. A marine structure comprising the anti-fouling device of claim 1, wherein the anti-fouling device is attached to an outer surface of the marine structure.

8. The marine structure according to claim 7,
wherein there is at least one gap between at least two UV-C LEDs of the plurality of UV-C LEDs,
wherein the add-on light guide is a slab of light guiding material,
wherein the slab of light guiding material is arranged to fill the at least one gap.

9. The marine structure according to claim 8,
wherein the slap of light guiding material comprises at least two tiles,
wherein the at least two tiles are arranged to fill the at least one gap.

10. An anti-fouling device compressing:
an electric circuit,
wherein the electric circuit comprises a load,
wherein the load comprises a plurality of UV-C LEDs, and
an add-on light guide,
wherein the add-on light guide is configured to optically extend light output of the plurality of UV-C LEDs,
wherein the add-on light guide comprises a UV-C light guide,
wherein the UV-C light guide is configured to be optically coupled to the plurality of UV-C LEDs,
wherein no UV-C light is generated within the UV-C light guide,
wherein the electric circuit has only a single power supply wire,
wherein the electric circuit further comprises:
a first electrode coupled to each UV-C of the plurality of UV-C LEDs,
a plurality of second electrodes coupled to the plurality of UV-C LEDs,
wherein the first electrode is coupled to the single power supply wire that is configured to be coupled to an output of an external power supply, and
wherein each second electrode of the plurality of second electrodes comprises a plate that is configured to capacitively couple to an external conductive surface.

11. The anti-fouling device of claim 10, wherein the first electrode is coupled to each UV-C through a rectifier.

12. The anti-fouling device of claim 11, wherein the rectifier comprises a diode bridge.

13. The anti-fouling device of claim 10, further comprising one or more resistors coupled to pairs of the second electrodes.

14. The anti-fouling device of claim 10,
wherein the plurality of UV-C LEDs and the add-on light guide are configured for being arranged at an outer surface of a marine structure,
wherein the outer surface is an electrically conductive element,
wherein the plurality of second electrodes is insulated from the outer surface,
wherein each second electrode and the outer surface forms a capacitor that is configured for capacitive transmission of electrical power between each second electrode and the outer surface.

15. A marine structure comprising the anti-fouling device of claim 10, wherein the anti-fouling device is attached to an outer surface of the marine structure.

* * * * *